(12) United States Patent
Chou et al.

(10) Patent No.: US 10,818,558 B2
(45) Date of Patent: Oct. 27, 2020

(54) SEMICONDUCTOR STRUCTURE HAVING TRENCH AND MANUFACTURING METHOD THEREOF

(71) Applicant: TAIWAN SEMICONDUCTOR MANUFACTURING CO., LTD., Hsinchu (TW)

(72) Inventors: Chen-Cheng Chou, Tainan (TW); Shiu-Ko Jangjian, Tainan (TW); Cheng-Ta Wu, Shueishang Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/738,527

(22) Filed: Jun. 12, 2015

(65) Prior Publication Data
US 2016/0315014 A1   Oct. 27, 2016

Related U.S. Application Data

(60) Provisional application No. 62/152,192, filed on Apr. 24, 2015.

(51) Int. Cl.
*H01L 21/8234* (2006.01)
*H01L 21/762* (2006.01)
(Continued)

(52) U.S. Cl.
CPC ......... *H01L 21/823481* (2013.01); *H01L 21/02164* (2013.01); *H01L 21/02304* (2013.01);
(Continued)

(58) Field of Classification Search
CPC ......... H01L 21/823481; H01L 27/0886; H01L 29/0649; H01L 21/0223; H01L 21/02255;
(Continued)

(56) References Cited

U.S. PATENT DOCUMENTS 9,224,675 B1 * 12/2015 DeHaven ............. H01L 23/481
2003/0011044 A1 * 1/2003 Oh ..................... H01L 21/76235
257/566
(Continued)

FOREIGN PATENT DOCUMENTS

CN         102867774 A      1/2013
KR    10-2003-0058576 A    7/2003
(Continued)

OTHER PUBLICATIONS

Matsuda, S. et al., Novel Corner Rounding Process for Shallow Trench Isolation Utilizing MSTS (Micro-Structure Transformation of Silicon), International Electron Devices Meeting 1998, S. 137~140.

*Primary Examiner* — Thanh Y. Tran
(74) *Attorney, Agent, or Firm* — Maschoff Brennan

(57) ABSTRACT

A method for manufacturing a semiconductor structure is provided. A plurality of trenches are formed in a substrate. The trenches define at least one fin therebetween. The fin is hydrogen annealed. A dielectric material is formed in the trenches. The dielectric material in the trenches is recessed.

20 Claims, 5 Drawing Sheets

(51) Int. Cl.
*H01L 21/02* (2006.01)
*H01L 21/324* (2006.01)
*H01L 27/088* (2006.01)

(52) U.S. Cl.
CPC .... *H01L 21/02312* (2013.01); *H01L 21/3247* (2013.01); *H01L 21/762* (2013.01); *H01L 21/76224* (2013.01); *H01L 21/823431* (2013.01); *H01L 27/0886* (2013.01)

(58) Field of Classification Search
CPC ....... H01L 21/02271; H01L 21/823431; H01L 21/324; H01L 21/76224–76237; H01L 29/7851; H01L 29/7853; H01L 29/7854
See application file for complete search history.

(56) References Cited

U.S. PATENT DOCUMENTS

| | | |
|---|---|---|
| 2003/0119256 A1 | 6/2003 | Dong et al. |
| 2004/0080018 A1* | 4/2004 | Kim .................. H01L 21/76224 257/510 |
| 2004/0262676 A1* | 12/2004 | Lee .................. H01L 29/66795 257/328 |
| 2007/0108513 A1* | 5/2007 | Rub .................... H01L 29/0653 257/329 |
| 2008/0070420 A1 | 3/2008 | Lee |
| 2010/0163971 A1 | 7/2010 | Hung et al. |
| 2012/0070953 A1* | 3/2012 | Yu ....................... H01L 21/2236 438/301 |
| 2012/0217468 A1 | 8/2012 | Tekleab et al. |
| 2013/0078818 A1 | 3/2013 | Lin et al. |
| 2014/0065794 A1* | 3/2014 | Kar .................... H01L 21/76208 438/424 |
| 2014/0191324 A1* | 7/2014 | Cai ....................... H01L 29/785 257/368 |
| 2014/0227858 A1 | 8/2014 | Shen et al. |
| 2014/0231919 A1 | 8/2014 | Peng et al. |
| 2014/0353795 A1* | 12/2014 | Tong ................. H01L 21/76224 257/506 |
| 2015/0097239 A1 | 4/2015 | Chen et al. |
| 2015/0144998 A1 | 5/2015 | Ching et al. |
| 2015/0380253 A1* | 12/2015 | Lee .................... H01L 21/28185 438/591 |
| 2016/0233088 A1* | 8/2016 | Feng ................... H01L 21/2256 |
| 2016/0240609 A1* | 8/2016 | Liu ....................... H01L 29/785 |

FOREIGN PATENT DOCUMENTS

| | | |
|---|---|---|
| KR | 10-2005-0028575 A | 3/2005 |
| KR | 10-2009-0047002 A | 5/2009 |
| KR | 10-2014-0103828 A | 8/2014 |

* cited by examiner

SEMICONDUCTOR STRUCTURE HAVING TRENCH AND MANUFACTURING METHOD THEREOF

PRIORITY CLAIM AND CROSS-REFERENCE

This application claims priority to U.S. Provisional Application Ser. No. 62/152,192, filed Apr. 24, 2015, which is herein incorporated by reference.

BACKGROUND

The present disclosure relates generally to semiconductor devices, and more specifically to fin type field effect transistors (FinFETs).

Double-gate metal-oxide-semiconductor field-effect transistors (Double-gate MOSFETs) are MOSFETs that incorporate two gates into a single device. These devices are also known as fin type field effect transistors (FinFETs) due to their structure including a thin "fin" extending from a substrate. The double gate is in that there is a gate on both sides of the channel allowing gate control of the channel from both sides. Furthermore, FinFETs can reduce the short channel effect and provide higher current flow. Other FinFET architectures may include three or more effective gates as well.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
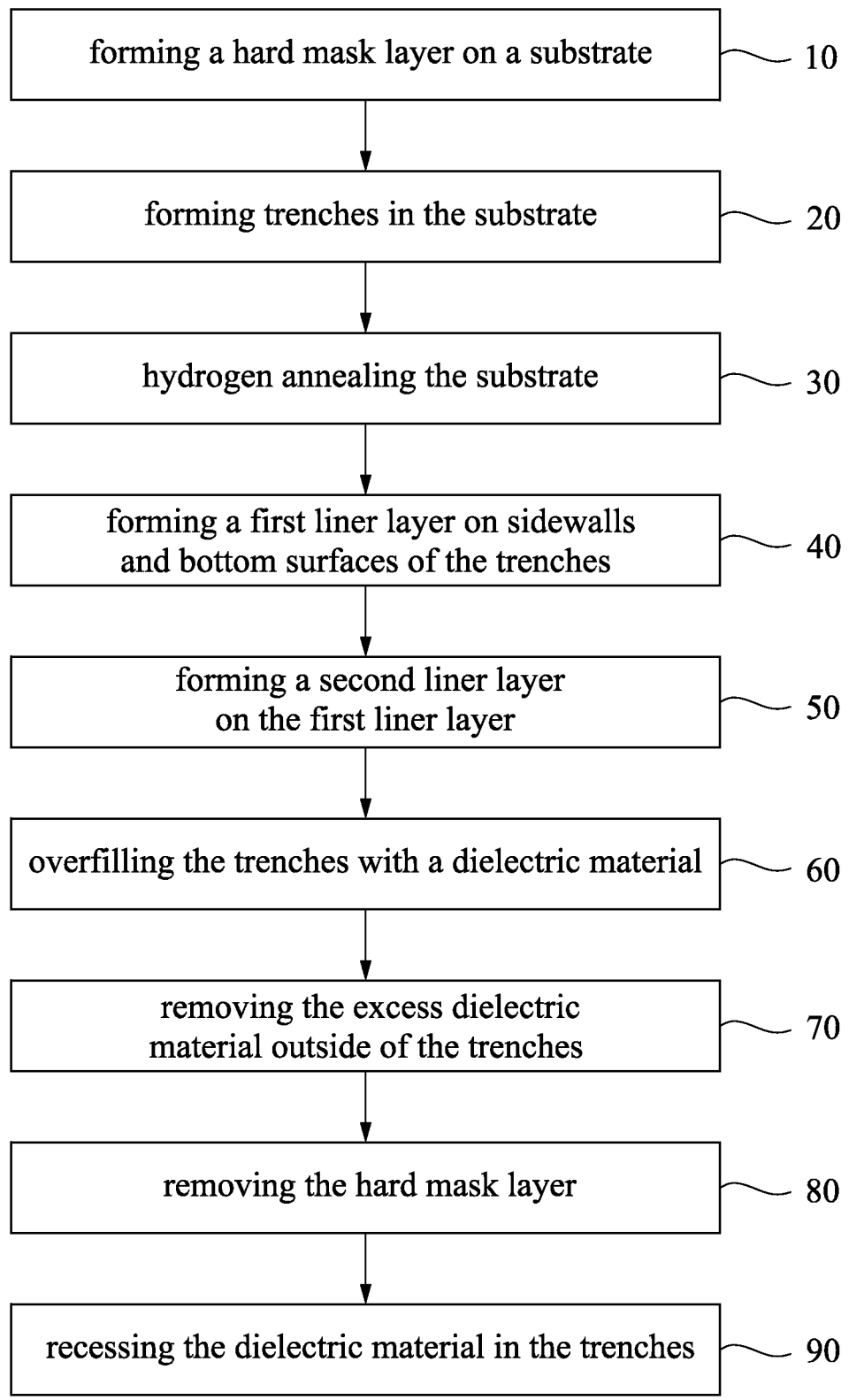
FIG. 1 is a flowchart of a method for manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
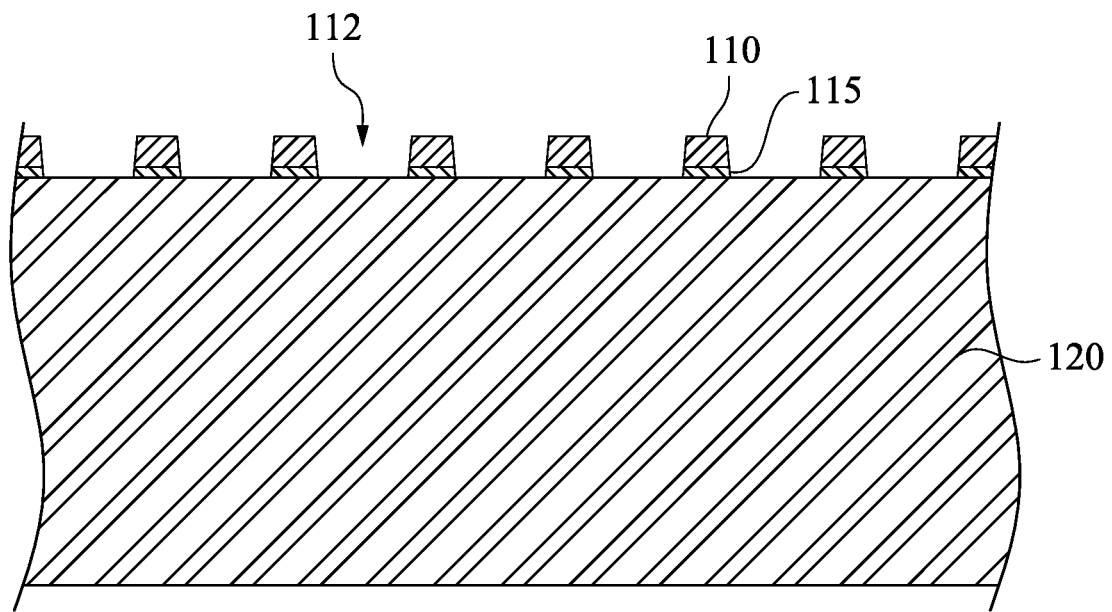
FIGS. 2-9 are cross-sectional views of the semiconductor structure at various stages in accordance with some embodiments of the present disclosure.
Figure 3:
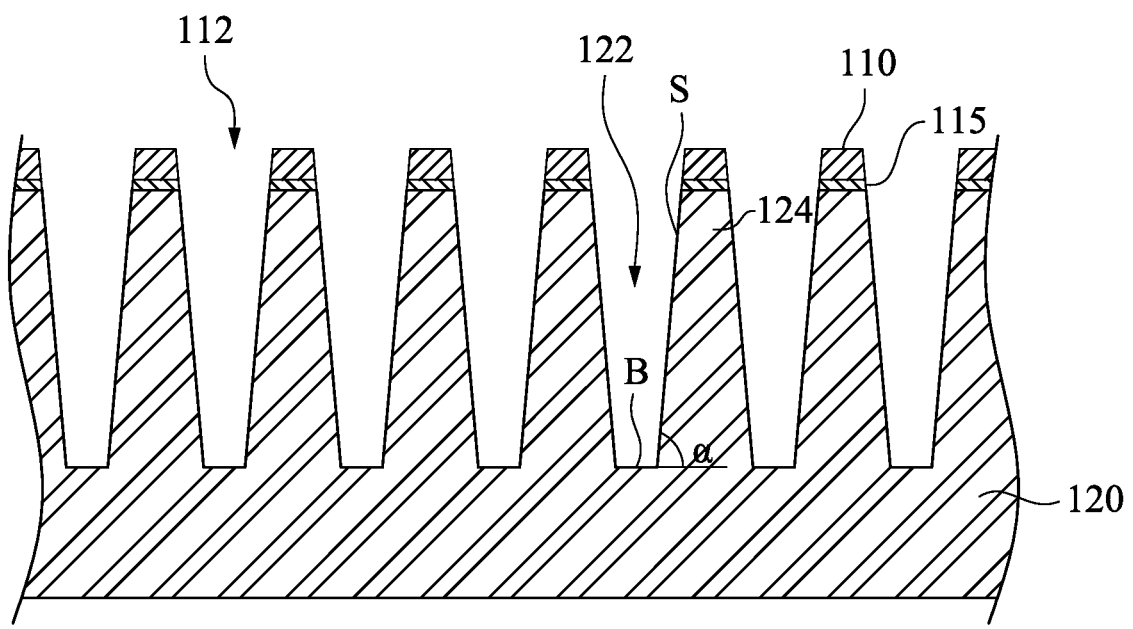
Figure 4:
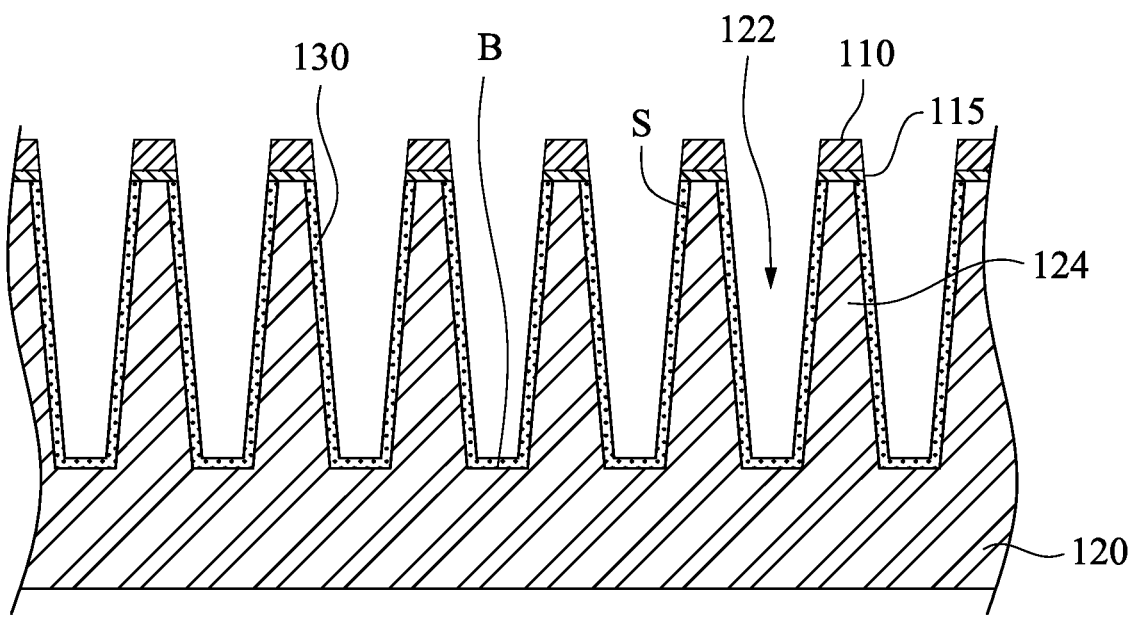
Figure 5:
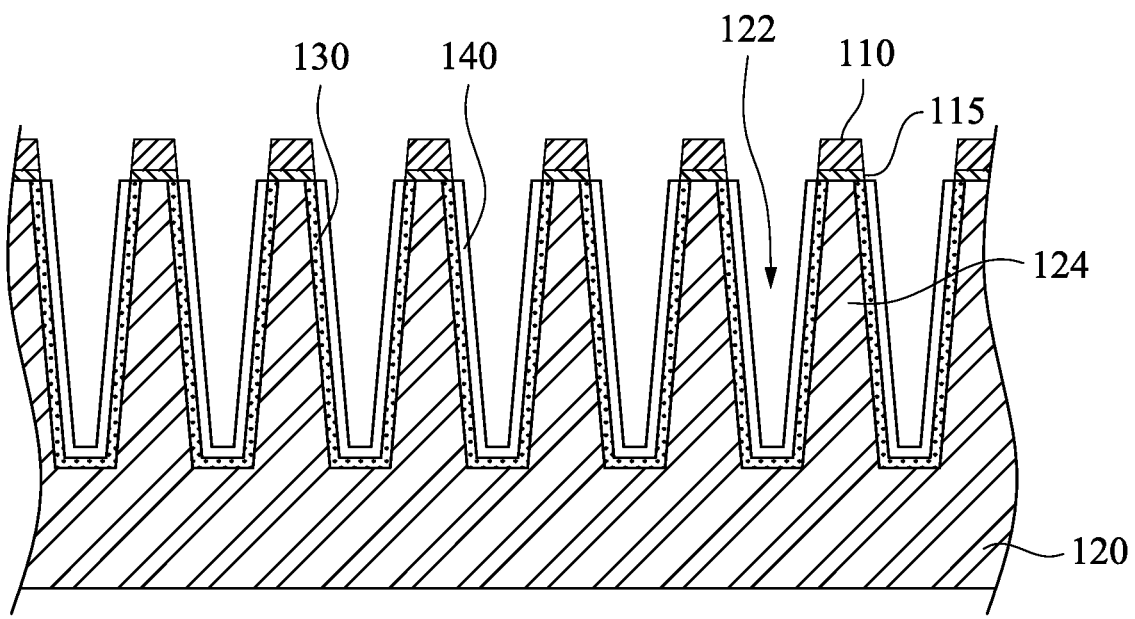
Figure 6:
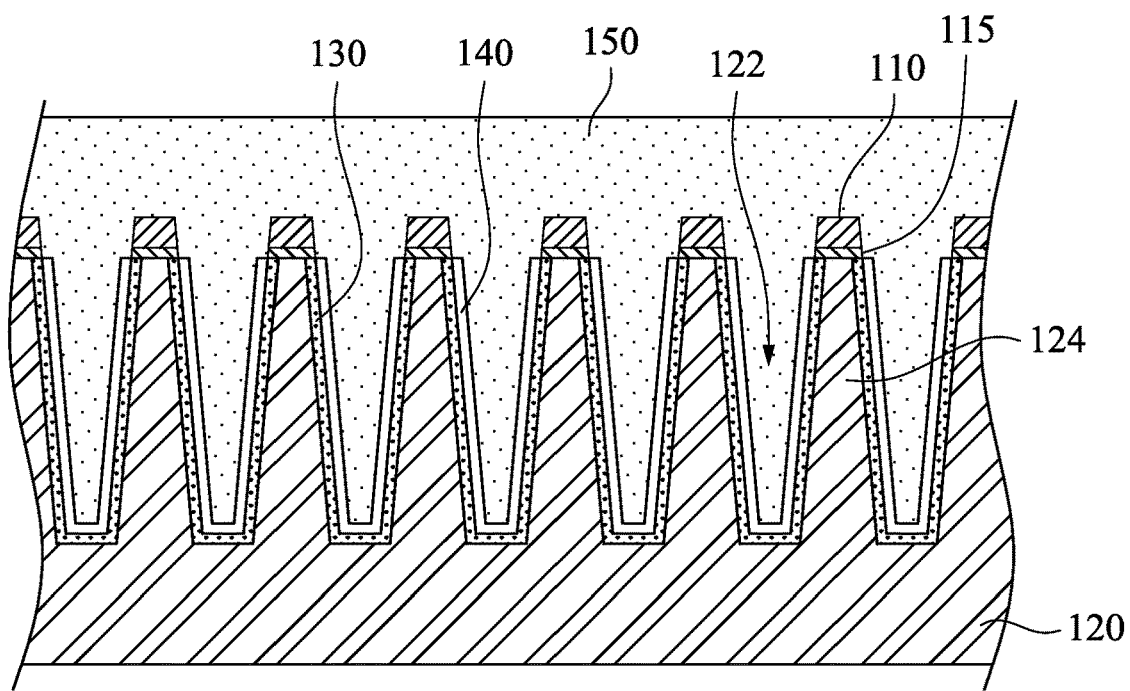
Figure 7:
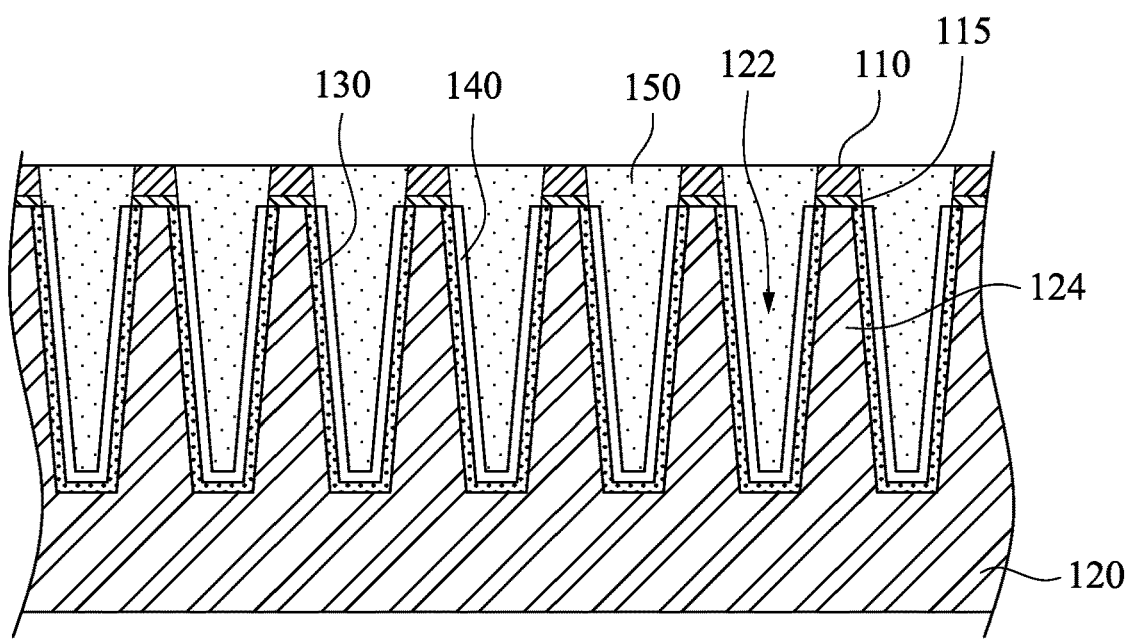
Figure 8:
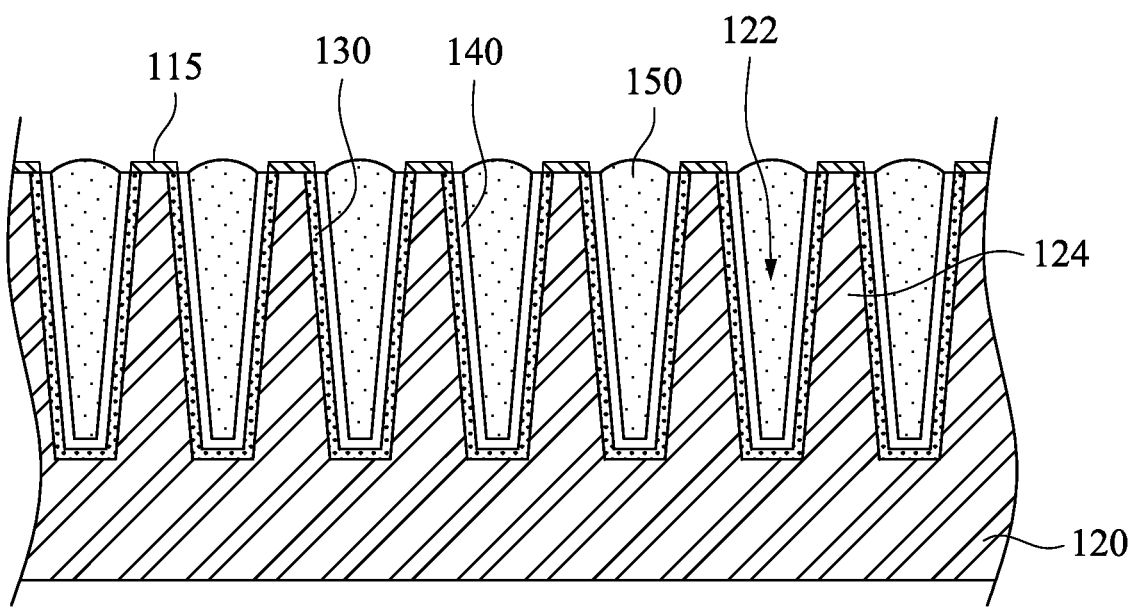
Figure 9:
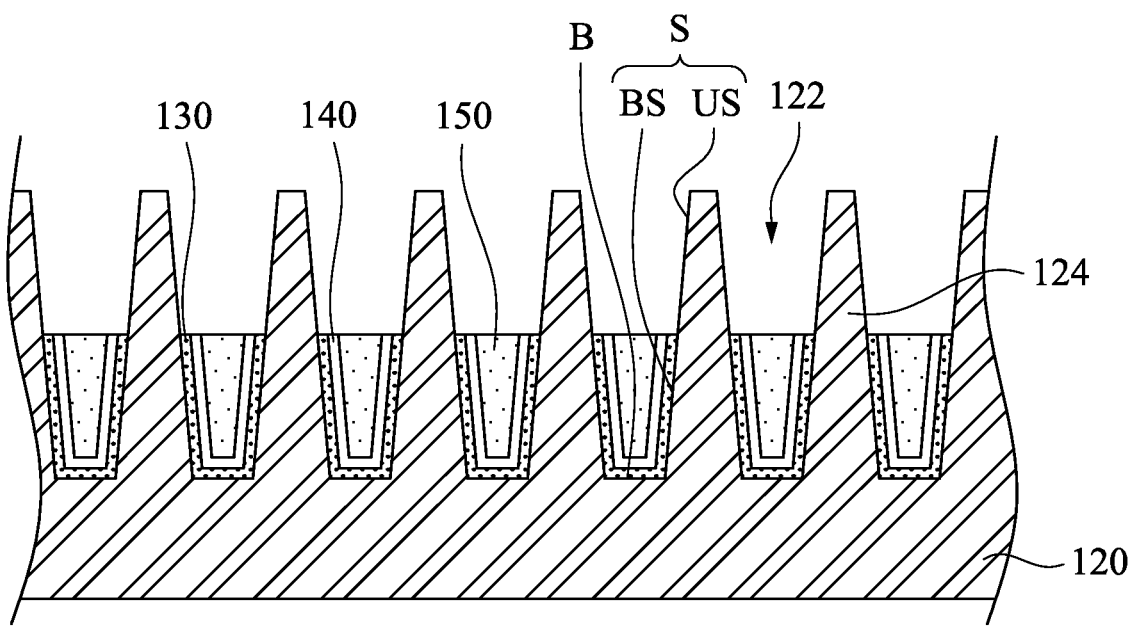

FIG. 1 is a flowchart of a method for manufacturing a semiconductor structure in accordance with some embodiments of the present disclosure. FIGS. 2-9 are cross-sectional views of the semiconductor structure at various stages in accordance with some embodiments of the present disclosure. The method begins with block 10 in which a hard mask layer 110 is formed on a substrate 120 (as shown in FIG. 2). The method continues with block 20 in which trenches 122 are formed in the substrate 120 (as shown in FIG. 3). The method continues with block 30 in which the substrate 120 are hydrogen annealed (as shown in FIG. 3). The method continues with block 40 in which a first liner layer 130 is formed on sidewalls S and bottom surfaces B of the trenches 122 (as shown in FIG. 4). The method continues with block 50 in which a second liner layer 140 is formed on the first liner layer 130 (as shown in FIG. 5). The method continues with block 60 in which a dielectric material 150 overfills the trenches 122 (as shown in FIG. 6). The method continues with block 70 in which the excess dielectric material 150 outside of the trenches 122 is removed (as shown in FIG. 7). The method continues with block 80 in which the hard mask layer 110 is removed (as shown in FIG. 8). The method continues with block 90 in which the dielectric material 150 in the trenches 122 is recessed (as shown in FIG. 9).

Reference is made to FIG. 2. A hard mask layer 110 is formed on a substrate 120 and has openings 112 therein to define fins which will be formed in the followings steps. The substrate 120 is made of a semiconductor material, such as diamond, silicon (Si), germanium (Ge), silicon carbide (SiC), silicon-germanium (SiGe), or combinations thereof. The substrate 120 is, for example, doped or undoped bulk silicon (Si). Other substrates that may be used include multi-layered substrates, gradient substrates, or hybrid orientation substrates.

The hard mask layer 110 is made of a material which can be a barrier against water molecules ($H_2O$) and oxygen (O). In some embodiments, the hard mask layer 110 is made of, for example, silicon nitride ($Si_3N_4$). The hard mask layer 110 has a thickness in a range from about 400 angstroms to about 2000 angstroms. The hard mask layer 110 is formed by, for example, chemical vapor deposition (CVD), low pressure chemical vapor deposition (LPCVD), plasma enhanced chemical vapor deposition (PECVD), or other deposition processes.

The terms "about" may be applied to modify any quantitative representation which could permissibly vary without resulting in a change in the basic function to which it is related. For example, the hard mask layer 110 as disclosed herein having a thickness in a range from about 400 angstroms to about 2000 angstroms may permissibly have a thickness somewhat less than 400 angstroms if its barrier capability is not materially altered.

A barrier layer 115 may be formed on the substrate 120 before the hard mask layer 110 is formed. The barrier layer 115 is made of a material which can enhance an adhesion between the hard mask layer 110 and the substrate 120. In some embodiments, the barrier layer 115 is made of, for example, silicon oxide ($SiO_2$). The barrier layer 115 has a thickness in a range from about 50 angstroms to about 200 angstroms. The barrier layer 115 is formed by, for example, thermal oxidation, chemical vapor deposition (CVD), or other deposition processes.

Although FIG. 2 shows the barrier layer 115 is sandwiched between the hard mask layer 110 and the substrate 120, the barrier layer 115 could permissibly be omitted. In some embodiments, the hard mask layer 110 can be formed on the substrate 120 in absence of the barrier layer 115 if the adhesion between the hard mask layer 110 and the substrate 120 is at an acceptable level.

The hard mask layer 110 and the barrier layer 115 are patterned to form the openings 112 therein to expose portions of the substrate 120 where trenches will be formed in the followings steps. The hard mask layer 110 and the barrier layer 115 are patterned by a photolithography and etching process. The photolithography and etching process includes photoresist application, exposure, developing, etching, and photoresist removal. The photoresist is applied onto the hard mask layer 110 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist. Portions of the hard mask layer 110 and the barrier layer 115 which are not protected by the remaining photoresist are etched to form the openings 112. The etching of the hard mask layer 110 and the barrier layer 115 may be, for example, reactive-ion etching (RIE).

The Reactive-ion etching (RIE) is a type of dry etching which has different characteristics than wet etching. Reactive-ion etching (RIE) uses chemically reactive plasma to form the openings 112. The plasma is generated under low pressure (vacuum) by an electromagnetic field. High-energy ions from the chemically reactive plasma attack the hard mask layer 110 and the barrier layer 115 and react with them. In some embodiments, fluorocarbon or hydrofluorocarbon based reactive-ion etching (RIE) can be used to form the openings 112.

After etching the hard mask layer 110 and the barrier layer 115, the photoresist is removed from the hard mask layer 110 by, for example, plasma ashing or stripping. Plasma ashing uses a plasma source to generate a monatomic reactive species, such as oxygen or fluorine. The reactive species combines with the photoresist to form ash which is removed with a vacuum pump. Stripping uses a photoresist stripper, such as acetone or a phenol solvent, to remove the photoresist from the hard mask layer 110.

A cleaning process may be performed to remove a native oxide of the substrate 120 after the hard mask layer 110 and the barrier layer 115 are patterned. In some embodiments, the native oxide of the substrate 120 can be removed by hydrofluoric acid (HF) when the substrate 120 is made of silicon (Si). The cleaning process is optional. In some embodiments, the cleaning process can be omitted if the native oxide of the substrate 120 is at an acceptable level.

Reference is made to FIG. 3. Trenches 122 are formed in the substrate 120. The trenches 122 define the fins 124. That is, the trenches 122 separate the fins 124 from one another. The exposed portions of the substrate 120 through the openings 112 are removed by an etching process, such as reactive-ion etching (RIE), in order to form the trenches 122 in the substrate 120.

In some embodiments, chlorine (Cl) or bromine (Br) based reactive-ion etching (RIE) can be used to form the trenches 122. At least one of the trenches 122 has a depth in a range from about 0.3 µm to about 0.5 µm. At least one of the trenches 122 has at least one sidewall S, a bottom surface B, and a taper angle $\alpha$ between the sidewall S and a plane extending from the bottom surface B. The taper angle $\alpha$ of the trench 122 is in a range from about 78° to about 88°.

After the formation of the fins 124, the fins 124 and the substrate 120 are hydrogen annealed to smooth the sidewalls S and the bottom surfaces B of the trenches 122. That is, the fins 124 and substrate 120 are annealed in an atmosphere including a hydrogen containing gas. The hydrogen containing gas includes, for example, steam ($H_2O$), ammonia ($NH_3$), or combinations thereof. In some embodiments, a temperature for the hydrogen containing gas annealing is in a range from about 500 degrees Celsius to about 1100 degrees Celsius. If the temperature for the hydrogen containing gas annealing is lower than about 500 degrees Celsius, then the hydrogen containing gas annealing may not smooth the sidewalls S and the bottom surfaces B of the trenches 122. If the temperature for the hydrogen containing gas annealing is higher than about 1100 degrees Celsius, then the hydrogen containing gas annealing may significantly increase the thermal budget of the semiconductor structure fabrication. In some embodiments, the temperature for the hydrogen containing gas annealing is in a range from about 790 degrees Celsius to about 950 degrees Celsius. A partial pressure for the hydrogen is in a range from about 1 torr to about 900 torr.

The terms "about" may be applied to modify any quantitative representation which could permissibly vary without resulting in a change in the basic function to which it is related. For example, the temperature for the hydrogen containing gas annealing as disclosed herein in a range from about 500 degrees Celsius to about 1100 degrees Celsius may permissibly be somewhat lower than 500 degrees Celsius if its smoothing capability is not materially altered.

The hydrogen containing gas annealing transforms at least one portion of the sidewalls S and the bottom surfaces B of the trenches 122 into a hydrogen-terminated surface. The hydrogen-terminated surface has at least one dangling bond terminated with at least one hydrogen atom. When the substrate 120 and/or the fins 124 are made of silicon (Si), the hydrogen-terminated surface has at least one silicon to hydrogen (Si—H) bond.

The hydrogen containing gas annealing can repair structural damage incurred in the substrate 120 and/or the fins 124 by the etching process for forming the trenches 122 and thus smooth the sidewalls S and the bottom surfaces B of the trenches 122. If the sidewalls S and the bottom surfaces B of the trenches 122 are rough, corners or tips created by the rough surfaces may act as stress concentrators within the fins 124 causing them to crack. In some embodiments, since the sidewalls S and the bottom surfaces B of the trenches 122 are smoothed by the hydrogen containing gas annealing, when a bending force is applied on the fins 124, the force is evenly distributed over the fins 124, and thus cracks can be prevented from initiating and growing. In some embodiments, the sidewalls S and the bottom surfaces B of the trenches 122 may be smooth to an atomic level when the substrate 120 and/or the fins 124 are made of silicon (Si).

Reference is made to FIG. 4. A first liner layer 130 is formed on the sidewalls S and the bottom surfaces B of the trenches 122. In some embodiments, the first liner layer 130 is made of, for example, silicon oxide ($SiO_2$). The first liner layer 130 has a thickness in a range from about 5 angstroms to about 100 angstroms. The first liner layer 130 may be formed by, for example, thermal oxidation with in-situ generated steam (ISSG). In some embodiments, a temperature for the formation of the first liner layer 130 is in a rage from about 800 degrees Celsius to about 1200 degrees Celsius.

Although FIG. 4 shows the first liner layer 130 is formed on the sidewalls S and the bottom surfaces B of the trenches 122, the first liner layer 130 could permissibly be omitted. In some embodiments, a dielectric material can be formed in the trenches 122 in absence of the first liner layer 130 if the structural damage incurred in the substrate 120 and/or the fins 124 are acceptable.

After the formation of the first liner layer 130, the substrate 120 and the fins 124 are annealed to further repair the structural damage incurred in the substrate 120 and/or the fins 124 by the etching process for forming the trenches 122. In some embodiments, the substrate 120 and the fins 124 are annealed in an oxygen-free environment. In some embodiments, a temperature for annealing the substrate 120 and the fins 124 is in a range from about 900 degrees Celsius to about 1200 degrees Celsius. In some embodiments, a process time for annealing the substrate 120 and the fins 124 is in a range about 15 minutes to about 60 minutes. This annealing process is optional. In some embodiments, the annealing process can be omitted if the structural damage incurred in the substrate 120 and/or the fins 124 are acceptable.

Reference is made to FIG. 5. A second liner layer 140 is formed on the first liner layer 130. In some embodiments, the second liner layer 140 is made of, for example, silicon oxide ($SiO_2$). The second liner layer 140 has a thickness in a range from about 10 angstroms to about 100 angstroms. The second liner layer 130 may be formed by, for example, chemical vapor deposition (CVD) or, more specifically, plasma enhanced atomic layer deposition (PEALD).

Although FIG. 5 shows the second liner layer 140 is formed on the first liner layer 130, the second liner layer 140 could permissibly be omitted. In some embodiments, a dielectric material can be formed in the trenches 122 in absence of the second liner layer 140 if the structural damage incurred in the substrate 120 and/or the fins 124 are acceptable.

Reference is made to FIG. 6. A dielectric material 150 overfills the trenches 122. The dielectric material 150 includes, for example, silicon oxide ($SiO_2$), silicon nitride ($Si_3N_4$), silicon oxynitride ($SiO_xN_y$), or combinations thereof. In some embodiments, the dielectric material 150 is formed by, for example, chemical vapor deposition (CVD). In some other embodiments, the dielectric material 150 includes a flowable dielectric material to improve trench fill capability. The flowable dielectric material includes, for example, hydrogen sisesquioxane (HSQ), poly-arylene ethers (PAE), porous silicon oxide (i.e. the xerogel or the aerogel), methyl silsesquioxane (MSQ), methyl silsesquioxane (MSQ)/hydrogen sisesquioxane (HSQ), perhydrosilazane (TCPS), perhydro-polysilazane (PSZ), silicate, siloxane, or combinations thereof. The flowable dielectric material is formed by, for example, spin coating.

Then, a curing process is performed on the flowable dielectric material. In the curing process, the flowable dielectric material is baked to drive off excess solvent and to cure the flowable dielectric material. In some embodiments, a temperature for the curing process is in a range from about 150 degrees Celsius to about 500 degrees Celsius.

Reference is made to FIG. 7. The excess dielectric material 150 outside of the trenches 122 is removed through a removal process. In some embodiments, the dielectric material 150 over burden is removed by a chemical mechanical polishing (CMP) process. In some embodiments, a combination of a plasma etch-back followed by the chemical mechanical polishing (CMP) process is used. The hard mask layer 110 acts as a polish stop layer to protect the underlying fins 124 from chemical mechanical polishing (CMP) damage.

Reference is made to FIG. 8. The hard mask layer 110 is removed by an etching process, such as a wet etching process. In some embodiments, the hard mask layer 110 can be removed by hot phosphoric acid ($H_3PO_4$) when the hard mask layer 110 is made of silicon nitride ($Si_3N_4$).

Reference is made to FIG. 9. The dielectric material 150 in the trenches 122 is recessed. That is, an upper portion of the dielectric material 150 in the trenches 122 is removed. The recessing of the dielectric material 150 may be performed by, for example, a wet etching process. In some embodiments, the dielectric material 150 can be recessed by hydrofluoric acid (HF) when the dielectric material 150 is made of silicon oxide ($SiO_2$).

At least one of the sidewalls S of the trenches 122 is separated into an upper portion US and a buried portion BS. In the recessing of the dielectric material 150, the first liner layer 130, the second liner layer 140, and the dielectric material 150 on the upper portions US of the sidewalls S of the trenches 122 are removed. Furthermore, the barrier layer 115 may be removed in the recessing of the dielectric material 150 as well when the barrier layer 115, the first liner layer 130, the second liner layer 140, and the dielectric material 150 are made of substantially the same material, such as silicon oxide ($SiO_2$). Therefore, after the recessing of the dielectric material 150, the upper portions US of the sidewalls S of the trenches 122 are exposed from the first liner layer 130, the second liner layer 140, and the dielectric material 150 while the buried portions BS of the sidewalls S of the trenches 122 are covered by the first liner layer 130, the second liner layer 140, and/or the dielectric material 150.

Since the fins 124 and substrate 120 are hydrogen containing gas annealed before the formations of the first liner layer 130, an interface between the first liner layer 130 and an combination of the fins 124 and substrate 120 are hydrogen-terminated. That is, the interface between the first liner layer 130 and the combination of the fins 124 and substrate 120 has at least one dangling bond terminated with at least one hydrogen atom. When the fins 124 and substrate 120 are made of silicon (Si), the interface between the first liner layer 130 and the combination of the fins 124 and substrate 120 has at least one silicon to hydrogen (Si—H) bond. Furthermore, when the fins 124 and substrate 120 are made of silicon (Si), the interface between the first liner layer 130 and the combination of the fins 124 and substrate 120 may be smooth to the atom level.

In FIG. 9, at least one of the buried portions BS of the sidewalls S and the bottom surfaces 150 of the trenches 122 is a hydrogen-terminated surface. That is, at least one of the buried portions BS of the sidewalls S of the trenches 122 has at least one dangling bond terminated with at least one hydrogen atom, and/or at least one of the bottom surfaces B of the trenches 122 has at least one dangling bond terminated with at least one hydrogen atom. When the fins 124 and/or substrate 120 are made of silicon (Si), at least one of the buried portions BS of the sidewalls S of the trenches 122 has at least one silicon to hydrogen (Si—H) bond, and/or at least one of the bottom surfaces B of the trenches 122 has at least one silicon to hydrogen (Si—H) bond. Furthermore, when the fins 124 and/or substrate 120 are made of silicon (Si), at least one of the buried portions BS of the sidewalls S of the trenches 122 may be smooth to the atom level, and/or at least one of the bottom surfaces B of the trenches 122 may be smooth to the atom level.

In FIG. 9, at least one of the upper portions US of the sidewalls S of the trenches 122 may be a hydrogen-terminated surface. That is, at least one of the upper portions US of the sidewalls S of the trenches 122 may have at least one dangling bond terminated with at least one hydrogen atom. When the fins 124 are made of silicon (Si), at least one of the upper portions US of the sidewalls S of the trenches 122 may have at least one silicon to hydrogen (Si—H) bond. Furthermore, when the fins 124 are made of silicon (Si), at least one of the upper portions US of the sidewalls S of the trenches 122 may be smooth to the atom level.

In some embodiments, the removals of the hard mask layer 110 and the barrier layer 115 may be performed after the recessing of the dielectric material 150. That is, the first liner layer 130, the second liner layer 140, and the dielectric material 150 on the upper portions US of the sidewalls S of the trenches 122 are removed first, and then the hard mask layer 110 and the barrier layer 115 are removed.

It is understood that for the embodiments shown above, additional steps may be performed to complete the fabrication of a fin type field effect transistor device (FinFET device). For example, these additional steps may include formation of gate dielectrics, formation of gates, formation of source and drain regions, formation of contacts, formation of interconnect structures (e.g., lines and vias, metal layers, and interlayer dielectric that provide electrical interconnection to the FinFET device), formation of passivation layers, and packaging of the FinFET device.

In order to repair structural damage incurred in the fins 124 by the etching process for forming the trenches 122, a hydrogen containing gas annealing process is performed on the fins 124. The hydrogen containing gas annealing process can smooth the sidewalls S and the bottom surfaces B of the trenches 122. Since the sidewalls S and the bottom surfaces B of the trenches 122 are smoothed by the hydrogen containing gas annealing process, when a bending force is applied on the fins 124, the force is evenly distributed over the fins 124, and thus cracks can be prevented from initiating and growing.

According to some embodiments, a method for manufacturing a semiconductor structure is provided. The method includes forming a plurality of trenches in a substrate, in which the trenches define at least one fin therebetween; hydrogen annealing the fin; forming a dielectric material in the trenches; and recessing the dielectric material in the trenches.

According to some embodiments, a method for manufacturing a semiconductor structure is provided. The method includes annealing a substrate in an atmosphere including a hydrogen containing gas, in which the substrate has a plurality fins disposed thereon and at least one trench separating the fins; filling the trench with a dielectric material; and removing an upper portion of the dielectric material to expose upper portions of the fins.

According to some embodiments, a semiconductor structure includes a substrate and a dielectric material. The substrate has a plurality of trenches to define at least one fin therebetween. The fin has at least one hydrogen-terminated surface. The dielectric material is disposed in the trenches and surrounds a bottom portion of the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, the method comprising:
    forming a plurality of trenches in a substrate, wherein the trenches define a fin having a hard mask layer on a top of the fin, wherein bottoms of the trenches are exposed;
    performing a hydrogen anneal process at least on the fin and the exposed bottoms of the trenches to smooth at least the fin and the exposed bottoms of the trenches, wherein the bottoms of the trenches remain exposed at least between forming the trenches and performing the hydrogen anneal process;
    subsequent to the hydrogen anneal process, forming a first liner layer on sidewalls of the fin, wherein the first liner layer has a first surface contacting the bottoms of the trenches and a second surface opposite the first surface, the second surface of the first liner layer is below a bottom surface of the hard mask layer;
    forming a second liner layer along the second surface of the first liner layer;
    forming a dielectric material over the first and the second liner layers in the trenches; and
    recessing the dielectric material in the trenches to expose an upper portion of the fin.

2. The method of claim 1, wherein the first liner layer is formed by thermal oxidation.

3. The method of claim 1, wherein the first liner layer is formed by thermal oxidation with in-situ generated steam (ISSG).

4. The method of claim 1, wherein forming the first liner layer comprises forming the first liner layer only below the hard mask layer.

5. The method of claim 1, further comprising prior to recessing the dielectric material in the trenches, removing the hard mask layer.

6. The method of claim 1, wherein forming the trenches is performed such that the sidewalls of the fin are exposed, and the hydrogen anneal process is performed to smooth the exposed sidewalls of the fin.

7. The method of claim 6, wherein the sidewalls of the fin remain exposed at least between forming the trenches and performing the hydrogen anneal process.

8. The method of claim 1, wherein an entirety of the first liner layer is below a bottom of the hard mask layer.

9. The method of claim 1, further comprising:
    polishing the dielectric material such that the dielectric material has a top surface substantially coplanar with a top surface of the hard mask layer.

10. A method for manufacturing a semiconductor structure, the method comprising:

patterning a substrate having a hard mask layer thereon to form a plurality of fin features with trenches in-between;

performing a smoothing treatment to the fin features;

subsequent to the smoothing treatment, forming a first liner layer directly on sidewalls and bottom surfaces of the trenches;

annealing the first liner layer and the fin features in an environment substantially free of oxygen;

forming a second liner layer on the first liner layer, wherein the first liner layer is between the second liner layer and the sidewalls of the trenches;

filling the trenches with a dielectric material; and removing an upper portion of the dielectric material to expose upper portions of the fin features.

11. The method of claim 10, wherein the smoothing treatment comprises hydrogen annealing performed in an atmosphere comprising steam ($H_2O$).

12. The method of claim 10, wherein the smoothing treatment comprises hydrogen annealing performed in an atmosphere comprising ammonia ($NH_3$).

13. The method of claim 10, wherein filling the trenches with the dielectric material comprises forming the dielectric material directly on the hard mask layer.

14. The method of claim 10, wherein the smoothing treatment is performed at a temperature in a range from about 500 degrees Celsius to about 1100 degrees Celsius.

15. A method for manufacturing a semiconductor structure, the method comprising:

forming a fin and a plurality of trenches, wherein the fin is below a hard mask layer and between two of the plurality of trenches;

performing a smoothing treatment to the fin;

subsequent to the smoothing treatment, forming a first liner layer directly on bottom surfaces of the trenches, wherein a top surface of the first liner layer is below a bottom surface of the hard mask layer;

forming a second liner layer on the first liner layer;

forming a dielectric material over the first and the second liner layers; and recessing the dielectric material to expose an upper portion of the fin.

16. The method of claim 15, wherein performing the smoothing treatment includes annealing the fin in an atmosphere including a hydrogen containing gas.

17. The method of claim 15, wherein the first liner layer is formed by thermally oxidizing sidewalls of the fin and the bottom surfaces of the trenches.

18. The method of claim 15, further comprising:

subsequent to forming the first liner layer, annealing the fin in an oxygen-free environment.

19. The method of claim 18, wherein annealing the fin in the oxygen-free environment is performed prior to forming the second liner layer.

20. The method of claim 15, further comprising:

annealing the fin and the first liner layer at a temperature in a range from about 900 degrees Celsius to about 1200 degrees Celsius.

* * * * *